United States Patent
Fouet

(10) Patent No.: US 12,532,431 B2
(45) Date of Patent: Jan. 20, 2026

(54) SYSTEM FOR COOLING A PLURALITY OF ELECTRICAL CONTROL UNITS

(71) Applicant: Volvo Truck Corporation, Gothenburg (SE)

(72) Inventor: Michel Fouet, Salagnon (FR)

(73) Assignee: Volvo Truck Corporation, Gothenburg (SE)

( * ) Notice: Subject to any disclaimer, the term of this patent is extended or adjusted under 35 U.S.C. 154(b) by 223 days.

(21) Appl. No.: 18/350,016

(22) Filed: Jul. 11, 2023

(65) Prior Publication Data
US 2024/0023270 A1    Jan. 18, 2024

(30) Foreign Application Priority Data
Jul. 18, 2022   (EP) .................................... 22185405

(51) Int. Cl.
*H05K 7/20*   (2006.01)

(52) U.S. Cl.
CPC ..... *H05K 7/20145* (2013.01); *H05K 7/20863* (2013.01)

(58) Field of Classification Search
CPC .......... H05K 7/20863; H05K 7/20145; H05K 7/20172; H05K 7/20909; B60H 1/00271; B60H 2001/003; B60H 1/00564; B60H 1/00821; B60R 16/0239; G06F 1/20
USPC ....................................................... 361/692
See application file for complete search history.

(56) References Cited

U.S. PATENT DOCUMENTS

| | | | |
|---|---|---|---|
| 5,979,540 A | 11/1999 | Allison et al. | |
| 6,330,155 B1* | 12/2001 | Remsburg | H05K 7/20154 236/49.5 |
| 6,639,794 B2* | 10/2003 | Olarig | H05K 7/20581 361/679.48 |
| 11,338,641 B2 | 5/2022 | Hendry et al. | |
| 2004/0074248 A1* | 4/2004 | Tanaka | B60H 1/00514 62/244 |
| 2009/0249803 A1* | 10/2009 | Suzuki | H01M 10/625 62/157 |
| 2010/0097751 A1* | 4/2010 | Doll | H05K 7/20736 361/679.53 |

(Continued)

FOREIGN PATENT DOCUMENTS

| | | |
|---|---|---|
| EP | 2928276 A1 | 10/2015 |
| WO | 2022104417 A1 | 5/2022 |

OTHER PUBLICATIONS

Extended European Search Report for European Patent Application No. 22185405.2, mailed Jan. 10, 2023, 7 pages.

*Primary Examiner* — Mandeep S Buttar
(74) *Attorney, Agent, or Firm* — Withrow & Terranova, PLLC

(57) ABSTRACT

A system for refreshing a plurality of electrical control units of a vehicle, wherein the system comprises an inlet manifold comprising an air inlet and a plurality of air outlets, the inlet manifold further comprising an air duct configured to provide a plurality of air flows through the plurality of air outlets, so that each air flow of the plurality of air flows flows directly on one of the electrical control units or directly between two adjacent electrical control units of the plurality of electrical control units, the system further comprising a fan configured to suck air from the vehicle into the air inlet and to drive the plurality of air flows.

15 Claims, 3 Drawing Sheets

(56) References Cited

U.S. PATENT DOCUMENTS

| | | | |
|---|---|---|---|
| 2013/0083481 A1* | 4/2013 | Goto | H05K 7/20836 |
| | | | 361/695 |
| 2015/0271957 A1* | 9/2015 | Pal | H05K 7/20863 |
| | | | 361/678 |
| 2019/0098799 A1* | 3/2019 | Richards | H05K 9/0015 |
| 2021/0185862 A1* | 6/2021 | Nagao | B60H 1/00271 |
| 2021/0300145 A1* | 9/2021 | Morrow | B60H 1/00271 |
| 2023/0166575 A1* | 6/2023 | Dhabu | B60H 1/00271 |
| 2024/0001789 A1* | 1/2024 | Walsh | B60L 53/31 |

* cited by examiner

SYSTEM FOR COOLING A PLURALITY OF ELECTRICAL CONTROL UNITS

RELATED APPLICATIONS

The present application claims priority to European Patent Application No. 22185405.2, filed on Jul. 18, 2022, and entitled "SYSTEM FOR COOLING A PLURALITY OF ELECTRICAL CONTROL UNITS," which is incorporated herein by reference in its entirety.

TECHNICAL FIELD

The invention relates to a system for cooling a plurality of electrical control units.

The invention can be applied in heavy-duty vehicles, such as trucks, buses and construction equipment, or in any kind of vehicle.

BACKGROUND

More and more features are requested into the trucks, and other types of vehicle, to increase the performance of the vehicle, with respect to various regulations related to safety, security, emissions, etc., or/and to increase the driver's quality of life when using/living in the trucks.

For that, various electrical devices are needed, and they produce too much heat inside the cab environment. In particular, more and more electrical devices, such as electrical control units ECU1, ECU2, ECU3, ECU4 are lodged inside an electric center EC behind an instrument panel IP inside the cab environment, as illustrated by FIGS. 1, 2, and 3.

Currently most electrical devices can resist, even in summer, the temperature they produce. Some of the existing systems may get a fan integrated but when too many devices are present, ventilating all of them is difficult.

SUMMARY

An object of the invention is to provide a system for refreshing a plurality of electrical control units of a vehicle in an efficient manner by way of cooling and/or ventilation. According to some examples, the system comprises an inlet manifold comprising an air inlet and a plurality of air outlets, the inlet manifold further comprising an air duct configured to provide a plurality of air flows through the plurality of air outlets, so that each air flow of the plurality of air flows directly on one of the electrical control units or directly between two adjacent electrical control units, of the plurality of electrical control units, the system further comprising a fan configured to suck an air from the vehicle into the air inlet and to drive the plurality of air flows. The air sucked from the vehicle can be cool air available at the instrument panel region or in some examples, from a cabin of the vehicle.

According to these provisions, the advantage is that each one of the plurality of electrical control units is being refreshed by a unique fan providing a plurality of air flows.

According to an example, the plurality of electrical control units is lodged inside an electrical center, and the fan is located outside of the electrical center.

According to these provisions, the maintenance of the system is easier.

According to an example, the electrical center is located behind an instrument panel of the vehicle, and the system is located behind the instrument panel.

According to an example, at least one air outlet among the plurality of air outlets is configured to provide an air flow from the electrical center to a windshield of the vehicle.

According to these provisions, the windshield may be demisted or defrosted.

According to an example, the air outlets are slot shaped.

According to these provisions, the direction of each airflow is better controlled, and the airflow is more efficient.

According to an example, the air inlet is a nozzle.

According to these provisions, the system is more efficient.

According to an aspect, an object of the invention is to provide a vehicle comprising a system according to anyone of the examples described herein above.

Further advantages and advantageous features of the invention are disclosed in the following description and in the dependent claims.

BRIEF DESCRIPTION OF THE DRAWINGS

With reference to the appended drawings, below follows a more detailed description of examples of the invention.

In the drawings.

DETAILED DESCRIPTION

Figure 1:
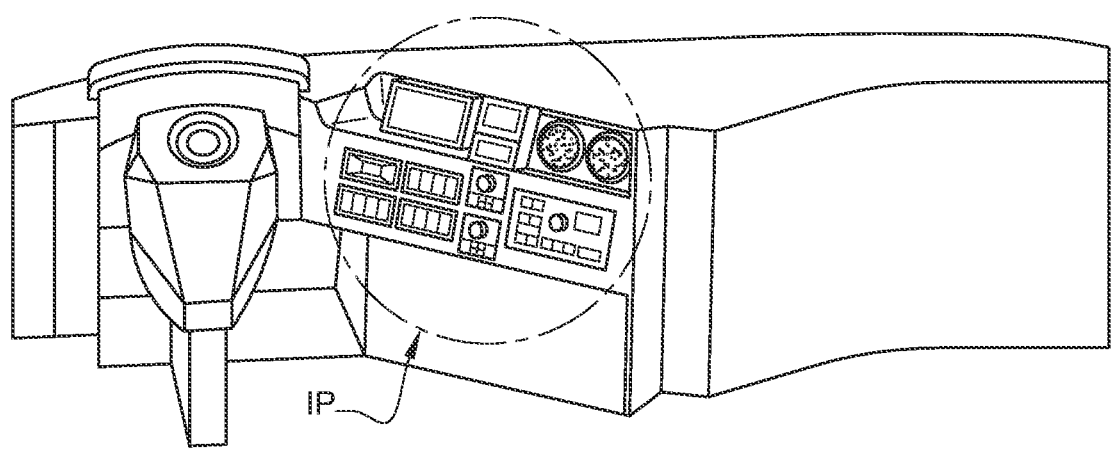
FIG. 1 is a representation of a cab environment of a vehicle, with a focus on the instrument panel.
Figure 2:
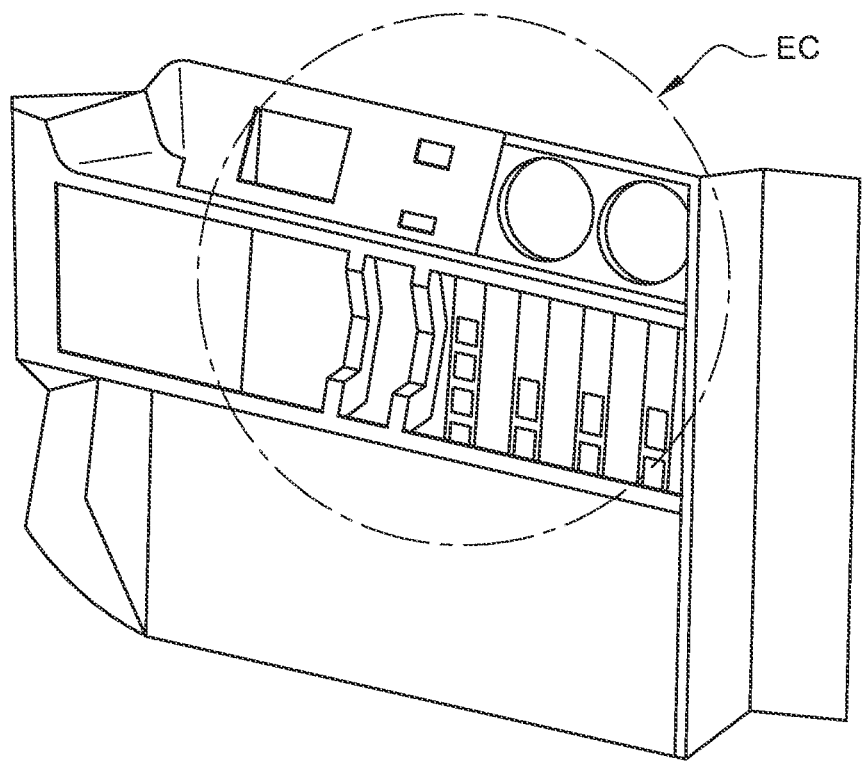
FIG. 2 is a representation of the electrical center behind the instrument panel.
Figure 3:
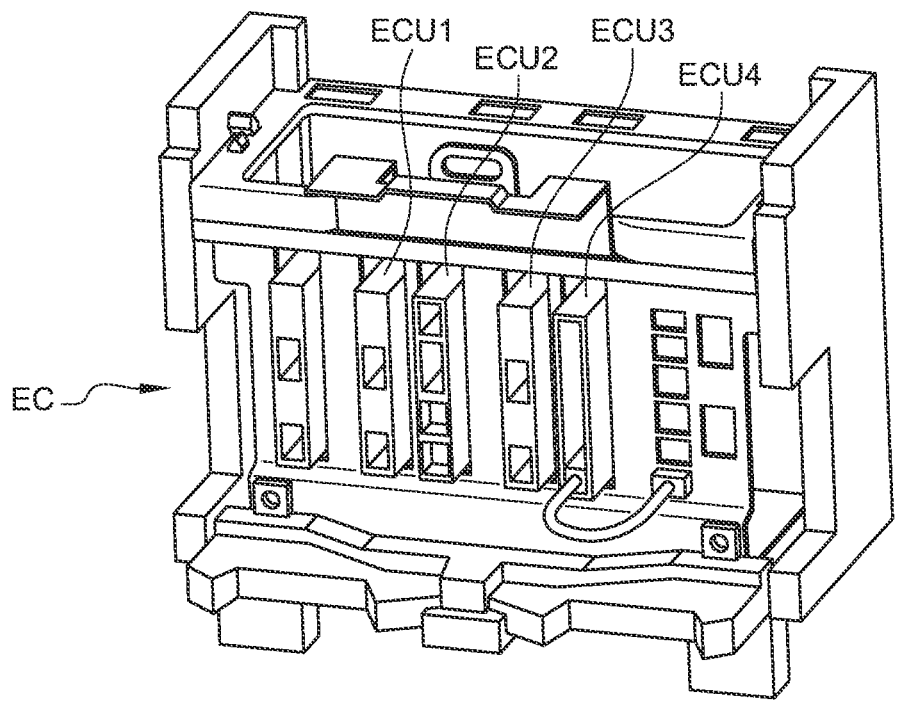
FIG. 3 is a representation of the electrical center comprising a plurality of electrical control units.
Figure 4:
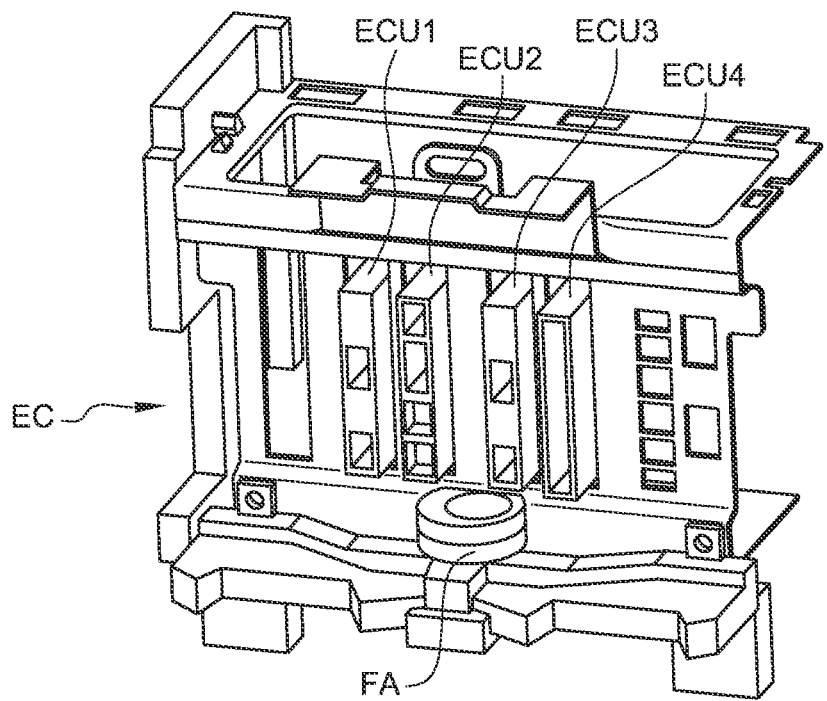
FIG. 4 is a representation of the electrical center with a fan integrated inside, according to prior art.

FIGS. 1, 2, and 3 illustrate an example of a system according to the invention, wherein a plurality of electrical control units ECU1, ECU2, ECU3, ECU4 are lodged inside an electric center EC behind an instrument panel IP inside the cab environment of a vehicle (not represented on the figures). A vehicle, especially a heavy-duty vehicle (e.g., truck) may include a cabin (alternatively, referred to as 'cab'), which is an environment used by user for operating the vehicle and for resting. For example, various controls, such as a steering system, vehicle motion controls, mechanical/electrical controls, etc. of the vehicle are disposed in the cab environment. Further, various control switches, screens for displaying information, etc. are integrated into the instrument panel as illustrated in FIG. 1. The electric center EC is disposed behind the instrument panel, from the perspective of user/driver seated position in the vehicle. In some examples, the electric center EC may be at least partially integrated with the instrument panel IP. The electric center EC may be a casing that is configured to accommodate various electrical control units ECU1, ECU2, ECU3, ECU4.

Figure 5:
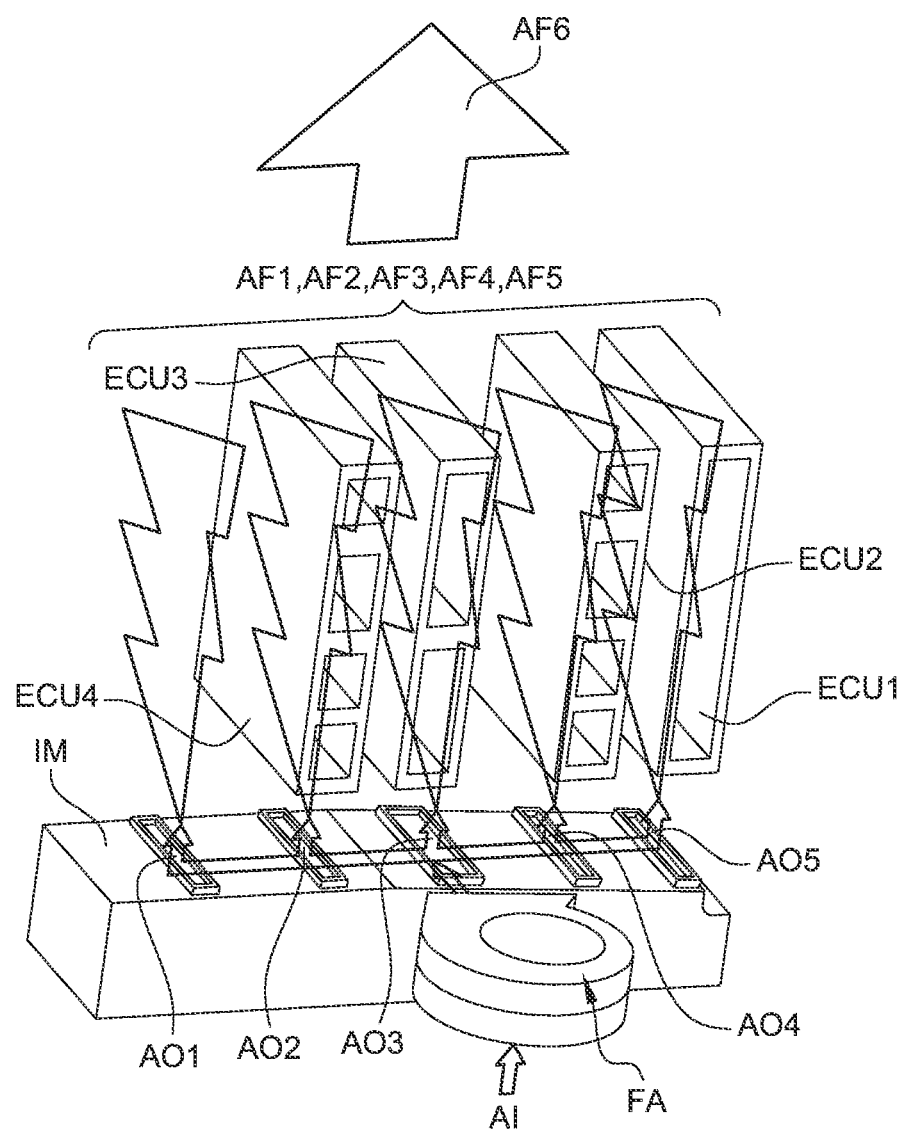
FIG. 5 is a representation of an example of the system for refreshing a plurality of electrical control units according to the invention.

The system according to the invention, as illustrated in FIG. 5, intends to refresh directly each electrical control units ECU1, ECU2, ECU3, ECU4.

To that effect, as illustrated on FIG. 5, the system includes an inlet manifold IM. The inlet manifold IM comprises a fan FA (not seen in FIG. 5, as the fan FA is enclosed by the intake manifold IM. Air is sucked thanks to the inlet manifold IM and by the fan FA. The inlet manifold IM comprises an air inlet AI. In some examples, the intake manifold IM is disposed rearward facing the instrument panel IP. The air inlet AI can be a nozzle. The nozzle is configured to control air flow rate, direction, speed, pressure, etc. for creating upward air flow. In some examples, the nozzle that works in conjunction with the fan FA to efficiently draw air into the system. As shown in FIG. 5, the system is disposed at a lower portion of or below the electric center EC. Cool air from region formed behind the instrument panel IP is drawn through the inlet manifold IM. and the system comprises a plurality of air outlets AO1, AO2, AO3, AO4, AO5, configured to drive the air drawn from inside the vehicle, for example from behind an instrument panel of the vehicle, towards the plurality of electrical control units ECU1, ECU2, ECU3, ECU4. The system along with the air outlets AO1, AO2, AO3, AO4 are configured to provide a plurality of air flows AF1, AF2, AF3, AF4, AF5 directed towards the plurality of electric control units ECU1, ECU2, ECU3, ECU4. Each air flow of the plurality of air flows AF1, AF2, AF3, AF4, AF5 flows directly on one of the electrical control units ECU1, ECU2, ECU3, ECU4, or directly between two adjacent electrical control units. More particularly, the air outlets may be slot shaped to improve the directivity of each air flow AF1, AF2, AF3, AF4, AF5.

According to some examples, the air duct may be at least partially integrated/enclosed by electric center EC and the intake manifold IM, and the fan FA are configured to be outside of the electric center EC when assembled. Thus, the intake manifold IM and the fan FA can be easily accessed for servicing.

Further, as illustrated in FIG. 5, the plurality of air outlets AO1, AO2, AO3, AO4 of the system are configured to provide air flow in upward direction. The system draws air from a lower portion behind the instrument panel IP and directs the drawn air towards the electrical control unit ECU1, ECU2, ECU3, ECU4 by convection. Further, the electric center EC and/or the electrical control units ECU1, ECU2, ECU3, ECU4 act as channels inherently without the need for providing any additional channels, which would otherwise make the system bulkier making it a challenge to accommodate behind the instrument panel IP. Further, the system effectively utilises the tendency of hot air to move in upward direction whereby cool air moved downward towards the intake manifold IM.

In particular, when the plurality of electrical control units ECU1, ECU2, ECU3, ECU4 are lodged in the electrical center EC, the fan FA and/or the inlet manifold IM, is/are located outside of the electrical center EC, for having an easier maintenance access. In some examples, the system can be detachable from the electric center EC for the purpose of cleaning or even for replacement of components of the system during maintenance. In some examples, the instrument panel IP may be configured to provide access to the system.

The residual ventilated air can that passes over the electrical control units ECU1, ECU2, ECU2, ECU3, ECU4, for example, may be used to demist or defrost a windshield of the vehicle. In some examples, with an air outlet configured to provide an air flow AF6 from the electrical center EC to a windshield of the vehicle. For example, this can be obtained via a special duct, not represented on FIG. 5, to provide air from the electrical center EC to an air outlet, not represented on FIG. 5, directed towards the windshield of the vehicle. The duct can be selectively operated to direct hot air from the ECU1-ECU4 towards the windshield, which is at least partially disposed forward to and at a height greater than the instrument panel IP.

It is to be understood that the present invention is not limited to the examples described above and illustrated in the drawings; rather, the skilled person will recognize that many changes and modifications may be made within the scope of the appended claims.

The invention claimed is:

1. A system for refreshing a plurality of electrical control units of a vehicle, comprising:
    an inlet manifold beneath the plurality of electrical control units, the inlet manifold comprising:
        an air inlet;
        a plurality of air outlets;
        an air duct configured to provide a plurality of air flows through the plurality of air outlets, each of the plurality of air outlets directly in line with one of the electrical control units so that each air flow of the plurality of air flows flows upward directly on one of the electrical control units in line with a flow path or directly between two adjacent electrical control units of the plurality of electrical control units on opposing sides of the flow path,
    a fan beneath the plurality of electrical control units, the fan configured to suck air from the vehicle into the air inlet and to drive the plurality of air flows.

2. The system of claim 1, wherein the plurality of electrical control units are lodged inside an electrical center, and the fan is located outside of the electrical center.

3. The system of claim 2, wherein the inlet manifold is located outside of the electrical center.

4. The system of claim 2, wherein the electrical center is located behind an instrument panel of the vehicle, and wherein the system is located behind the instrument panel.

5. The system of claim 1, wherein at least one air outlet among the plurality of air outlets is configured to provide an air flow from the electrical center to a windshield of the vehicle.

6. The system of claim 1, wherein the air outlets are slot shaped.

7. The system of claim 1, wherein the air inlet is a nozzle.

8. A system configured to cool a plurality of electrical control units of a vehicle comprising:
    an inlet manifold beneath the plurality of electrical control units, the inlet manifold comprising an air inlet, and an air duct configured to provide a plurality of air flows;
    a fan configured to suck air from the vehicle into the air inlet and to drive the plurality of air flows; and
    a plurality of air outlets, each of the plurality of air outlets directly in line with one of the electrical control units such that each air flow of the plurality of air flows flows upward directly on one of the electrical control units in line with a flow path or directly between two adjacent electrical control units of the plurality of electrical control units on opposing sides of the flow path.

9. The system of claim 8, wherein the plurality of electrical control units are mounted to an electric center, the electric center is disposed behind an instrument panel of the vehicle, and the system is disposed outside the electric center.

10. The system of claim 9, wherein the system is disposed below the electric center such that the system can be accessible independent of the electric center for maintenance.

11. The system of claim 9, wherein the system is at least partially integrated with the electric center.

12. The system of claim 8, wherein the air duct is provided with a plurality of slots for directing air towards an upward direction where the plurality of electrical control units are disposed.

13. The system of claim 8, wherein the air duct is at least partially integrated with the electric center and the intake manifold is configured to be outside of the electric center for ease of maintenance.

14. The system of claim 1, wherein the system is disposed below an electric center comprising the plurality of electrical control units such that the system can be independently accessible and removable from the electric center for maintenance.

15. The system of claim 8, wherein the system is disposed below an electric center comprising the plurality of electrical control units such that the system can be independently accessible and removable from the electric center for maintenance.

\* \* \* \* \*